United States Patent
Liu

(10) Patent No.: US 12,200,838 B2
(45) Date of Patent: Jan. 14, 2025

(54) LED DRIVER FOR PHOTOPLETHYSMOGRAPHY APPLICATION AND CURRENT DRIVER

(71) Applicant: REALTEK SEMICONDUCTOR CORPORATION, Hsinchu (TW)

(72) Inventor: Yen-Wei Liu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 136 days.

(21) Appl. No.: 18/132,585

(22) Filed: Apr. 10, 2023

(65) Prior Publication Data
US 2023/0371149 A1 Nov. 16, 2023

Related U.S. Application Data

(60) Provisional application No. 63/342,169, filed on May 16, 2022.

(51) Int. Cl.
*H05B 45/30* (2020.01)
*H03K 17/082* (2006.01)
*H05B 45/44* (2020.01)

(52) U.S. Cl.
CPC .......... *H05B 45/44* (2020.01); *H03K 17/082* (2013.01); *H05B 45/30* (2020.01)

(58) Field of Classification Search
CPC ...... H05B 45/30; H05B 45/34; H05B 45/345; H05B 45/357; H05B 45/40; H05B 45/44; H05B 45/46; H03K 17/08; H03K 17/082; H03K 17/0822
See application file for complete search history.

(56) References Cited

U.S. PATENT DOCUMENTS

| 6,825,619 | B2 | 11/2004 | Norris | |
| 9,622,303 | B1 * | 4/2017 | Wang | H05B 45/46 |
| 11,900,865 | B2 * | 2/2024 | Kwak | G09G 3/3426 |

OTHER PUBLICATIONS

Sant et al. "A 13.2 b Optical Proximity Sensor System With 130 klx Ambient Light Rejection Capable of Heart Rate and Blood Oximetry Monitoring", Jul. 2016, IEEE.
Marefat et al. "A 280 μW, 108 dB DR PPG-Readout IC With Reconfigurable, 2nd-Order, Incremental ΔΣM Front-End for Direct Light-to-Digital Conversion", Dec. 2020, IEEE.

(Continued)

*Primary Examiner* — Long Nguyen
(74) *Attorney, Agent, or Firm* — WPAT, PC

(57) ABSTRACT

An LED driver includes an operational amplifier (OP), N current driving circuits, and a resistor circuit. The OP compares a reference voltage with a feedback voltage to generate a control voltage. Each current driving circuit is coupled with an LED, and includes: an NMOS transistor including a drain, a source, and a gate, and being turned on according to the control voltage in an enablement mode and turned off according to the voltage of a ground terminal in a disablement mode, wherein the drain is coupled with the LED and the voltage at the source is the feedback voltage; and a switch circuit coupling the OP with the gate in the enablement mode, and coupling the ground terminal with the gate in the disablement mode. The resistor circuit is coupled between the source and the ground terminal and controls the current passing through the N current driving circuits.

12 Claims, 3 Drawing Sheets

(56) References Cited

OTHER PUBLICATIONS

Atef et al. "A Fully Integrated High-Sensitivity Wide Dynamic Range PPG Sensor With an Integrated Photodiode and an Automatic Dimming Control LED Driver", Jan. 2018, IEEE.
Winokur et al. "A Low-Power, Dual-Wavelength Photoplethysmogram (PPG) SoC With Static and Time-Varying Interferer Removal", Aug. 2015, IEEE.
Sharma et al. "A Sub-60-μA Multimodal Smart Biosensing SoC With >80-dB SNR, 35-μA Photoplethysmography Signal Chain", Apr. 2017, IEEE.

* cited by examiner

LED DRIVER FOR PHOTOPLETHYSMOGRAPHY APPLICATION AND CURRENT DRIVER

BACKGROUND OF THE INVENTION

1. Field of the Invention

The present disclosure relates to a driver, especially to an LED driver for a Photoplethysmography application and to a current driver.

2. Description of Related Art

The photoplethysmography (PPG) technology involves illuminating skin with a controllable light source (e.g., light emitting diode (LED)) and measuring the consequent variation in optical absorption, and thus can be applied to multiple kinds of applications (e.g., measurement of heartbeat and blood oxygen). A PPG electronic product may include a plurality of LEDs that are used for illuminating different positions of skin, and each of the LEDs is driven by a dedicated/shared current driving circuit. However, these LEDs may not operate simultaneously, and thus a switch (e.g., metal oxide semiconductor (MOS) transistor) is usually set between each LED and the corresponding current driving circuit to enable/disable this LED; accordingly, N switch(es) is/are set between N LED(s) and the corresponding current driving circuit(s). Regarding each current driving circuit, when the switch is turned on, the LED operates according to a driving current; and when the switch is turned off, the LED receives no current and does not operate.

On the basis of the above description, since each LED needs a large driving current (e.g., a current greater than 100 mA) when operating, the switch coupled with the LED needs to withstand the large driving current; accordingly, the circuit area of the switch is usually very large. However, this is disadvantageous to circuit miniaturization and leads to the increased cost.

SUMMARY OF THE INVENTION

An object of the present disclosure is to provide a light-emitting diode (LED) driver for a photoplethysmography (PPG) application and to provide a current driver. The LED driver and the current driver do not need switches of large circuit area and are favorable for circuit miniaturization and cost reduction.

An embodiment of the LED driver of the present disclosure for a PPG application includes an operational amplifier (OP), N current driving circuit(s), and a resistor circuit, wherein the N is a positive integer. The OP includes an OP input end, an OP inverting input end, and an OP output end, wherein the OP input end is for receiving a reference voltage, the OP inverting input end is for receiving a feedback voltage, and the OP output end is for output a control voltage. Each of the N current driving circuit(s) is coupled with an LED through an LED current path; in other words, the N current driving circuit(s) is/are coupled with N LED current path(s) respectively to be coupled with N LED(s). Each of the N current driving circuit(s) is configured to operate in one of an enablement mode and a disablement mode and includes an n channel metal oxide semiconductor (NMOS) transistor and a switch circuit. Regarding each of the N current driving circuit(s): the NMOS transistor includes a drain, a source, and a gate, wherein the drain is coupled with the LED current path via no switch, the source is coupled with the OP inverting input end via a feedback node, the gate is for receiving the control voltage in the enablement mode and for receiving a bias voltage at a bias terminal in the disablement mode, and a voltage at the feedback node is the feedback voltage; and the switch circuit is for coupling the OP output end with the gate in the enablement mode to allow the control voltage to control the NMOS transistor, and the switch circuit is further for coupling the bias terminal with the gate in the disablement mode to allow the bias voltage to turn off the NMOS transistor. The resistor circuit is coupled between the feedback node and a low voltage terminal and configured to determine a total current passing through the N current driving circuit(s) in conjunction with the feedback voltage.

An embodiment of the current driver of the present disclosure includes an OP, N current driving circuit(s), and a resistor circuit, wherein the N is a positive integer. The OP includes an OP input end, an OP inverting input end, and an OP output end, wherein the OP input end is for receiving a reference voltage, the OP inverting input end is for receiving a feedback voltage, and the OP output end is for output a control voltage. Each of the N current driving circuit(s) is coupled with a driven circuit through a current path; in other words, the N current driving circuit(s) is/are coupled with N current path(s) respectively to be coupled with N driven circuit(s). Each of the N current driving circuit(s) is configured to operate in one of an enablement mode and a disablement mode and includes an NMOS transistor and a switch circuit. Regarding each of the N current driving circuit(s): the NMOS transistor includes a drain, a source, and a gate, wherein the drain is coupled with the LED current path via no switch, the source is coupled with the OP inverting input end via a feedback node, the gate is for receiving the control voltage in the enablement mode and for receiving a bias voltage at a bias terminal in the disablement mode, and a voltage at the feedback node is the feedback voltage; and the switch circuit is for coupling the OP output end with the gate in the enablement mode to allow the control voltage to control the NMOS transistor, and the switch circuit is further for coupling the bias terminal with the gate in the disablement mode to allow the bias voltage to turn off the NMOS transistor. The resistor circuit is coupled between the feedback node and a low voltage terminal and configured to determine a total current passing through the N current driving circuit(s) in conjunction with the feedback voltage.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present specification discloses a light-emitting diode (LED) driver for a photoplethysmography (PPG) application and discloses a current driver. The LED driver and the current driver do not need switches of large circuit area and are favorable for circuit miniaturization and cost reduction.

Figure 1:
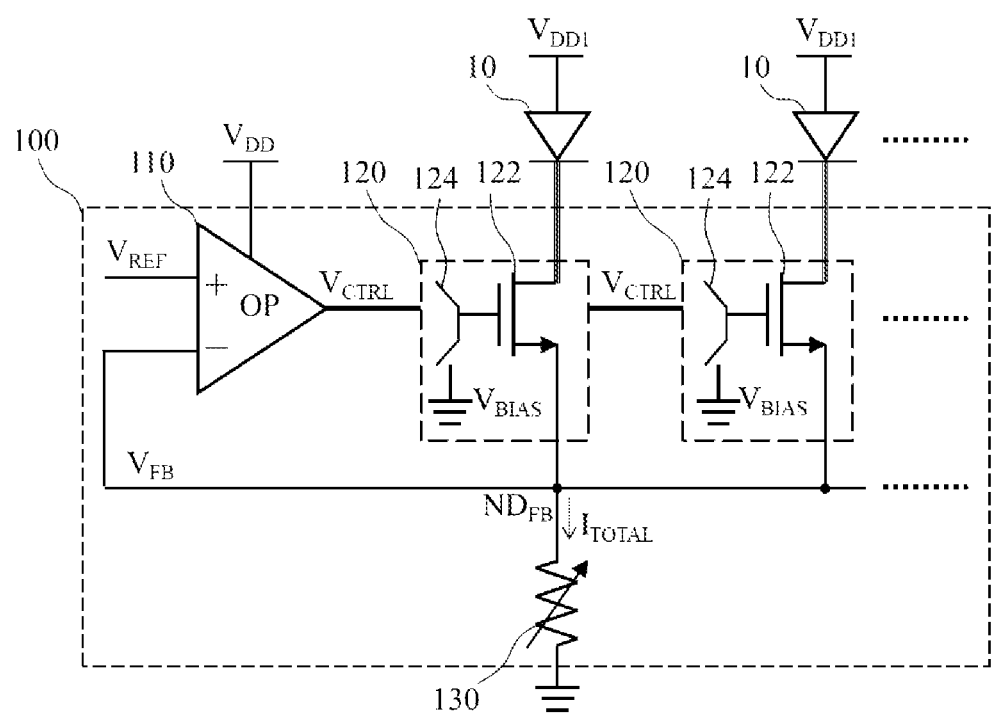
FIG. 1 shows an embodiment of the LED driver of the present disclosure for a Photoplethysmography application.

FIG. 1 shows an embodiment of the LED driver of the present disclosure for a PPG application. The LED driver 100 of FIG. 1 includes an operational amplifier (OP) 110, N current driving circuit(s) 120, and a resistor circuit 130, wherein the N is a positive integer (e.g., 1≤N≤5). These circuits are described in the following paragraphs.

As shown in FIG. 1, the OP 110 includes an OP input end (i.e., the symbol "+" in FIG. 1), an OP inverting input end (i.e., the symbol "−" in FIG. 1), and an OP output end. The OP input end is for receiving a reference voltage $V_{REF}$ that can be determined according to the demand for implementation. The OP inverting input end is for receiving a feedback voltage $V_{FB}$. Based on the virtual short-circuit feature of the OP 110, the feedback voltage $V_{FB}$ approximates to the reference voltage $V_{REF}$. The OP output end is for output a control voltage $V_{CTRL}$. The control voltage $V_{CTRL}$ is for controlling the operation of the N current driving circuit(s) 120. In addition, the OP 110 receives a supply voltage $V_{DD}$ and operates accordingly. The supply voltage $V_{DD}$ is determined according to the demand for implementation.

As shown in FIG. 1, each of the N current driving circuit(s) 120 is coupled with an LED current path and thereby coupled with an LED 10 through the LED current path; in other words, the N current driving circuit(s) 120 is/are coupled with N LED current path(s) respectively to be coupled with N LED(s) 10. In addition, the form and/or the component(s) (e.g., wire(s), trace(s), pad(s), or pin(s)) setup of each LED current path is dependent on the demand for implementation; and each LED 10 receives a supply voltage $V_{DD1}$ that is determined according to the demand for implementation and can be the same as or different from the aforementioned supply voltage $V_{DD}$. In this embodiment, no switch (e.g., a switch capable of withstanding 100 mA as mentioned in the description of related art) is set between the N current driving circuit(s) 120 and the N LED(s) 10 and thus the total circuit area of the LED driver 100 is reduced.

In regard to the embodiment of FIG. 1, each of the N current driving circuit(s) 120 is configured to operate in one of an enablement mode and a disablement mode. When any current driving circuit 120 operates in the enhancement mode, this current driving circuit 120 transmits current; and when any current driving circuit 120 operates in the disablement mode, this current driving circuit 120 does not transmit any current even though it is still electrically connected to the LED 10 through the LED current path.

As shown in FIG. 1, each of the N current driving circuit(s) 120 includes an n channel metal oxide semiconductor (NMOS) transistor 122 and a switch circuit 124. Regarding each of the N current driving circuit(s) 120: the NMOS transistor 122 includes a drain, a source, and a gate, wherein the drain is coupled with the LED current path via no switch, the source is coupled with the OP inverting input end via a feedback node $ND_{FB}$, the gate is for receiving the control voltage $V_{CTRL}$ in the enablement mode and for receiving a bias voltage $V_{BIAS}$ (e.g., a ground voltage) at a bias terminal (e.g., a ground terminal) in the disablement mode, and a voltage at the feedback node $ND_{FB}$ is the feedback voltage $V_{FB}$; the switch circuit 124 is for coupling the OP output end with the gate in the enablement mode to allow the control voltage $V_{CTRL}$ to control the NMOS transistor 122, and the switch circuit 124 is further for coupling the bias terminal with the gate in the disablement mode to allow the bias voltage $V_{BIAS}$ to turn off the NMOS transistor 122. It is noted that when the switch circuit 124 couples the OP output end with the NMOS transistor 122, the current (e.g., microamps (μA) or any current less than 1 mA) between the OP output end and the NMOS transistor 122 is very small, and therefore the switch circuit 124 of small circuit area is enough to withstand the current. For example, if the circuit area of a switch capable of withstanding 100 mA at most is $A_{SW\_100}$, the circuit area $A_{SW\_1}$ of a switch capable of withstanding 1 mA at most is one percent of $A_{SW\_100}$.

Figure 2:
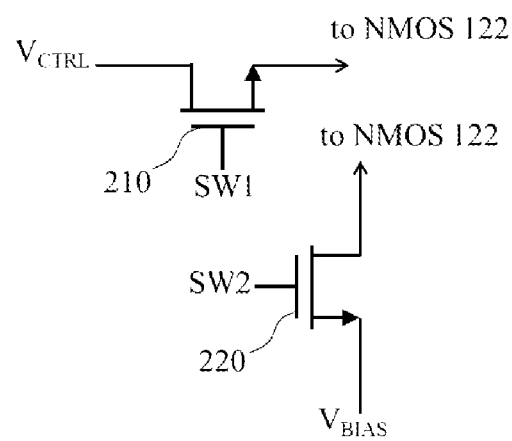
FIG. 2 shows an embodiment of the switch circuit of FIG. 1.

FIG. 2 shows an embodiment of the switch circuit 124 of FIG. 1. As shown in FIG. 2, the switch circuit 124 includes a first switch 210 and a second switch 220. The first switch 210 is configured to couple the OP output end with the gate of the NMOS transistor 122 according to a first switch signal SW1 in the enhancement mode and configured to be turned off according to the first switch signal SW1 in the disablement mode. The second switch 220 is configured to be turned off according to a second switch signal SW2 in the enhancement mode and configured to couple the bias terminal with the gate of the NMOS transistor 122 according to the second switch signal SW2 in the disablement mode. The implementation of the first switch signal SW1 and the second switch signal SW2 can be realized with known/self-developed technologies. When the NMOS transistor 122 has an NMOS circuit area $A_{NMOS}$ capable of withstanding a maximum LED current (e.g., 100 mA) at most, each of the first switch 210 and the second switch 220 has a switch circuit area $A_{SW}$ capable of withstanding a maximum switch current (e.g., 1 mA) at most and the NMOS circuit area $A_{NOMS}$ is greater than the switch circuit area $A_{SW}$ (e.g., $A_{NMOS} \geq 100 A_{SW}$); however, the implementation of the present invention is not limited to the above features. Other known/self-developed switch circuit can replace the switch circuit 124 of FIG. 2, if practicable.

As shown in FIG. 1, the resistor circuit 130 is coupled between the feedback node $ND_{FB}$ and a low voltage terminal (e.g., a ground terminal) and configured to determine the total current $I_{TOTAL}$ passing through the N current driving circuit(s) 120 in conjunction with the feedback voltage $V_{FB}$. For example, the total current $I_{TOTAL}$ is equal to the feedback voltage $V_{FB}$ divided by the resistance $R_{TOTAL}$ of the resistor circuit 130

$$\left(\text{i.e., } I_{TOTAL} = \frac{V_{FB}}{R_{TOTAL}}\right).$$

It is noted that provided "the N is greater than one, any two of the N current driving circuits 120 are the same or similar, M current driving circuit(s) 120 of the N current driving circuits 120 operate(s) in the enhancement mode, and the other (N-M) current driving circuit(s) 120 of the N current driving circuits 120 operate(s) in the disablement mode", the current of each of the M current driving circuit(s) 120 operating in the enhancement mode is between zero and $I_{TOTAL}$, and this depends on the amount of the current passing through each current driving circuit 120 (e.g., the current passing through a current driving circuit 120 that is not coupled with any LED being zero), wherein the M is a positive integer not greater than the N. It is also noted that the resistance $R_{TOTAL}$ of the resistor circuit 130 is fixed or adjustable, and this depends on the demand for implementation. The implementation of the fixed/adjustable resistance can be realized with known/self-developed technologies.

Figure 3:
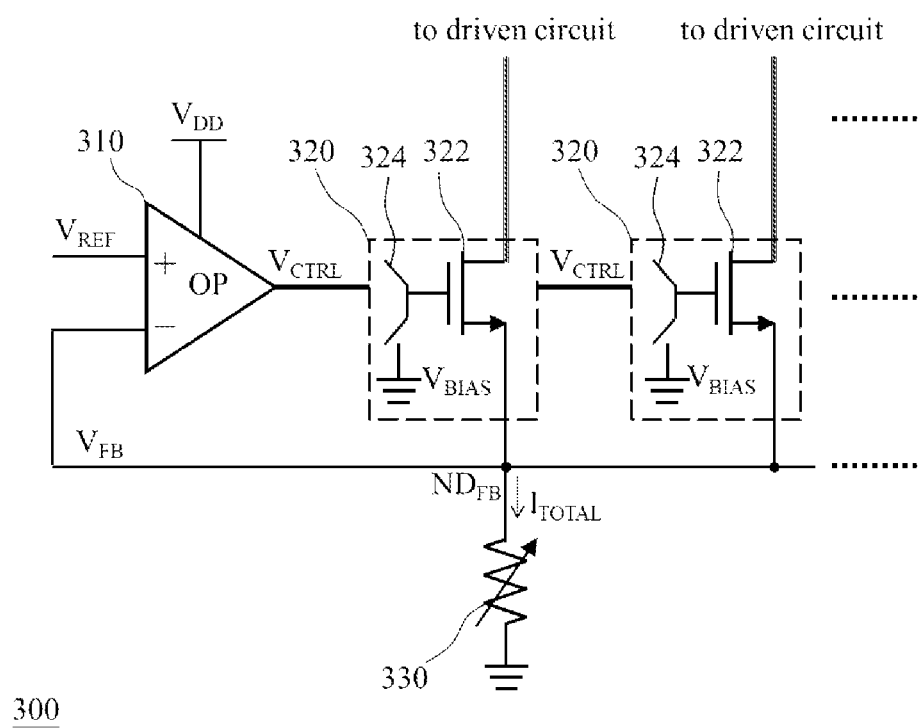
FIG. 3 shows an embodiment of the current driver of the present disclosure.

FIG. 3 shows an embodiment of the current driver of the present disclosure. The current driver 300 of FIG. 3 can be applied in a non-PPG application and includes an OP 310, N current driving circuit(s) 320, and a resistor circuit 330, wherein the N is a positive integer. The OP 310 includes an OP input end (i.e., the symbol "+" in FIG. 3), an OP inverting input end (i.e., the symbol "−" in FIG. 3), and an OP output end, wherein the OP input end is for receiving a reference voltage $V_{REF}$, the OP inverting input end is for receiving a feedback voltage $V_{FB}$, and the OP output end is for output a control voltage $V_{CTRL}$. Each of the N current driving circuit(s) 320 is coupled with a driven circuit (not shown in FIG. 3) through a current path; in other words, the N current driving circuit(s) 320 is/are coupled with N current path(s) respectively to be coupled with N driven circuit(s) (not shown in FIG. 3). Each of the N current driving circuit(s) 320 is configured to operate in one of an enablement mode and a disablement mode and includes an NMOS transistor 322 and a switch circuit 324. Regarding each of the N current driving circuit(s) 320: the NMOS transistor 322 includes a drain, a source, and a gate, wherein the drain is coupled with the current path via no switch, the source is coupled with the OP inverting input end via a feedback node $ND_{FB}$, the gate is for receiving the control voltage $V_{CTRL}$ in the enablement mode and for receiving a bias voltage $V_{BIAS}$ (e.g., a ground voltage) at a bias terminal (e.g., a ground terminal) in the disablement mode, and a voltage at the feedback node $ND_{FB}$ is the feedback voltage $V_{FB}$; and the switch circuit 324 is for coupling the OP output end with the gate in the enablement mode to allow the control voltage $V_{CTRL}$ to control the NMOS transistor 322, and the switch circuit 324 is further for coupling the bias terminal with the gate in the disablement mode to allow the bias voltage $V_{BIAS}$ to turn off the NMOS transistor 322. The resistor circuit 330 is coupled between the feedback node $ND_{FB}$ and a low voltage terminal (e.g., a ground terminal), and the resistor circuit 330 and the feedback voltage $V_{FB}$ jointly determine the total current $I_{TOTAL}$ passing through the N current driving circuit(s) 320.

Since those having ordinary skill in the art can refer to the disclosure of the embodiments of FIGS. 1-2 to appreciate the detail and modification of the embodiment of FIG. 3, repeated and redundant description is omitted here.

It is noted that people having ordinary skill in the art can selectively use some or all of the features of any embodiment in this specification or selectively use some or all of the features of multiple embodiments in this specification to implement the present invention as long as such implementation is practicable; in other words, the way to implement the present invention can be flexible based on the present disclosure.

To sum up, the LED driver for a PPG application and the current driver of the present disclosure can reduce the demand for switches of large circuit area and are favorable for circuit miniaturization and cost reduction.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:
1. A light-emitting diode (LED) driver for a Photoplethysmography (PPG) application, the LED driver comprising:
an operational amplifier (OP) including an OP input end, an OP inverting input end, and an OP output end, wherein the OP input end is for receiving a reference voltage, the OP inverting input end is for receiving a feedback voltage, and the OP output end is for output a control voltage;
N current driving circuit(s), wherein the N is a positive integer, each of the N current driving circuit(s) is coupled with an LED current path, the N current driving circuit(s) is/are coupled with N LED current path(s), and each of the N current driving circuit(s) is configured to operate in one of an enablement mode and a disablement mode and includes:
an n channel metal oxide semiconductor (NMOS) transistor including a drain, a source, and a gate, wherein the drain is coupled with the LED current path via no switch, the source is coupled with the OP inverting input end via a feedback node, the gate is for receiving the control voltage in the enablement mode and for receiving a bias voltage at a bias terminal in the disablement mode, and a voltage at the feedback node is the feedback voltage; and
a switch circuit for coupling the OP output end with the gate in the enablement mode to allow the control voltage to control the NMOS transistor, and the switch circuit further for coupling the bias terminal with the gate in the disablement mode to allow the bias voltage to turn off the NMOS transistor; and
a resistor circuit coupled between the feedback node and a low voltage terminal and configured to determine a total current passing through the N current driving circuit(s) in conjunction with the feedback voltage.

2. The LED driver for the PPG application of claim 1, wherein regarding each of the N current driving circuit(s), in the disablement mode the NMOS transistor is turned off while the drain of the NMOS transistor is electrically connected with an LED through the LED current path.

3. The LED driver for the PPG application of claim 1, wherein the N is greater than one, a part of the N current driving circuits operates in the enablement mode, and the other part of the N current driving circuits operates in the disablement mode.

4. The LED driver for the PPG application of claim 1, wherein regarding each of the N current driving circuit(s), the NMOS transistor has an NMOS circuit area capable of withstanding a maximum NMOS current, the switch circuit includes a first switch and a second switch, the first switch is configured to couple the OP output end with the gate in the enablement mode and the second switch is configured to couple the bias terminal with the gate in the disablement mode, each of the first switch and the second switch has a switch circuit area capable of withstanding a maximum switch current, and the NMOS circuit area is greater than the switch circuit area.

5. The LED driver for the PPG application of claim 1, wherein both the bias terminal and the low voltage terminal are ground terminals.

6. The LED driver for the PPG application of claim 1, wherein a total resistance value of the resistor circuit is adjustable.

7. A current driver comprising:
an operational amplifier (OP) including an OP input end, an OP inverting input end, and an OP output end, wherein the OP input end is for receiving a reference voltage, the OP inverting input end is for receiving a feedback voltage, and the OP output end is for output a control voltage;
N current driving circuit(s), wherein the N is a positive integer, each of the N current driving circuit(s) is coupled with a current path and thus the N current driving circuit(s) is/are coupled with N current path(s), and each of the N current driving circuit(s) is configured to operate in one of an enablement mode and a disablement mode and includes:

an NMOS transistor including a drain, a source, and a gate, wherein the drain is coupled with the current path via no switch, the source is coupled with the OP inverting input end via a feedback node, the gate is for receiving the control voltage in the enablement mode and for receiving a bias voltage at a bias terminal in the disablement mode, and a voltage at the feedback node is the feedback voltage; and a switch circuit for coupling the OP output end with the gate in the enablement mode to allow the control voltage to control the NMOS transistor, and the switch circuit further for coupling the bias terminal with the gate in the disablement mode to allow the bias voltage to turn off the NMOS transistor; and a resistor circuit coupled between the feedback node and a low voltage terminal and configured to determine a total current passing through the N current driving circuit(s) in conjunction with the feedback voltage.

8. The current driver of claim 7, wherein regarding each of the N current driving circuit(s), in the disablement mode the NMOS transistor is turned off while the drain of the NMOS transistor is electrically connected with a driven circuit through the current path.

9. The current driver of claim 7, wherein the N is greater than one, a part of the N current driving circuits operates in the enablement mode, and the other part of the N current driving circuits operates in the disablement mode.

10. The current driver of claim 7, wherein regarding each of the N current driving circuit(s), the NMOS transistor has an NMOS circuit area capable of withstanding a maximum NMOS current, the switch circuit includes a first switch and a second switch, the first switch is configured to couple the OP output end with the gate in the enablement mode and the second switch is configured to couple the bias terminal with the gate in the disablement mode, each of the first switch and the second switch has a switch circuit area capable of withstanding a maximum switch current, and the NMOS circuit area is greater than the switch circuit area.

11. The current driver of claim 7, wherein both the bias terminal and the low voltage terminal are ground terminals.

12. The current driver of claim 7, wherein a total resistance value of the resistor circuit is adjustable.

* * * * *